United States Patent
Galy et al.

(10) Patent No.: US 11,387,354 B2
(45) Date of Patent: Jul. 12, 2022

(54) BIMOS TRANSISTOR

(71) Applicant: STMicroelectronics SA, Montrouge (FR)

(72) Inventors: Philippe Galy, Le Touvet (FR); Louise De Conti, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 146 days.

(21) Appl. No.: 16/870,116

(22) Filed: May 8, 2020

(65) Prior Publication Data
US 2020/0357902 A1 Nov. 12, 2020

(30) Foreign Application Priority Data
May 9, 2019 (FR) ...................... 1904839

(51) Int. Cl.
H01L 29/739 (2006.01)
H01L 29/08 (2006.01)
H01L 29/10 (2006.01)
H01L 29/423 (2006.01)

(52) U.S. Cl.
CPC ...... H01L 29/7394 (2013.01); H01L 29/0847 (2013.01); H01L 29/1033 (2013.01); H01L 29/42376 (2013.01)

(58) Field of Classification Search
CPC .................. H01L 29/7394; H01L 27/0277
See application file for complete search history.

(56) References Cited

U.S. PATENT DOCUMENTS

| | | | |
|---|---|---|---|
| 9,019,666 B2 | 4/2015 | Bourgeat et al. | |
| 2002/0109187 A1 | 8/2002 | Matsumoto et al. | |
| 2010/0001347 A1 | 1/2010 | Sugiura | |
| 2013/0141824 A1* | 6/2013 | Bourgeat | H01L 27/0274 361/56 |
| 2017/0288059 A1 | 10/2017 | Athanasiou et al. | |

OTHER PUBLICATIONS

Philippe Galy et al., "Ultracompact ESD Protection With BIMOS Merged Dual Back-to-Back SCR in Hybrid Bulk 28-nm FD-SOI Advanced CMOS Technology", Oct. 2017, IEEE Transactions on Electron Devices, vol. 64, pp. 3991-3997 (Year: 2017).*
INPI Search Report and Written Opinion or FR 1904839 dated Jan. 10, 2020 (8 pages).
Ph. Galy et al:" BIMOS transistor and its applications in ESD protection in Advanced CMOS technology", 2012 IEEE International Conference on IC Design & Technology, May 1, 2012 (May 1, 2012), pp. 1-4, XP055067244, DOI: 10.1109/ICICDT.2012. 6232878 ISBN/ 978-1-46-730144-2 * le document en entier *.

* cited by examiner

Primary Examiner — Changhyun Yi
(74) Attorney, Agent, or Firm — Crowe & Dunlevy

(57) ABSTRACT

A BiMOS-type transistor includes a gate region, a channel under the gate region, a first channel contact region and a second channel contact region. The first channel contact region is electrically coupled to the gate region to receive a first potential. The second channel contact region is electrically coupled to receive a second potential.

23 Claims, 3 Drawing Sheets

BIMOS TRANSISTOR

PRIORITY CLAIM

This application claims the priority benefit of French Application for Patent No. 1904839, filed on May 9, 2019, the content of which is hereby incorporated by reference in its entirety to the maximum extent allowable by law.

TECHNICAL FIELD

The present disclosure generally concerns electronic circuits and, more particularly, circuits of protection against electrostatic discharges. The present disclosure more particularly applies to a BiMOS-type transistor.

BACKGROUND

Issues due to electrostatic discharges are all the more present nowadays as the component size in electronic circuits decreases. The protection of electronic circuits against electrostatic discharges is an important issue to ensure the reliability and the durability of the circuits.

There thus is a permanent need for electrostatic discharge protection circuits having a higher performance.

There is a need in the art for electrostatic discharge protection circuits having a higher performance.

SUMMARY

An embodiment overcomes all or part of the disadvantages of known electrostatic discharge protection circuits.

An embodiment provides a BiMOS-type transistor comprising: a gate region; a first channel contact region coupled to said gate region; and a second channel contact region capable of receiving a reference potential.

According to an embodiment, the first and second channel contact regions are arranged at opposite ends of the transistor.

According to an embodiment, the transistor is formed inside and on top of a SOI structure.

According to an embodiment, the transistor is formed inside and on top of a FDSOI structure.

According to an embodiment, the transistor is formed inside and on top of an electrically-insulated portion of a solid substrate.

According to an embodiment, the first and second channel contact regions are P-type doped regions in contact with a channel region of the transistor positioned under a gate region of the transistor.

According to an embodiment, the first and second channel contact regions are very heavily-doped P-type regions.

According to an embodiment, the channel region and the gate region have, in top view, an H shape comprising a first and a second branches parallel to each other, and a third branch coupling the first and second branches and being perpendicular to the first and second branches.

According to an embodiment, the first channel contact region is in contact with the first branch of the channel region, and the second channel contact region is in contact with the second branch of the channel region.

According to an embodiment, the source and drain regions are positioned on either side of the third branch of the channel region.

According to an embodiment, the reference voltage is the ground.

According to an embodiment, the reference voltage is an output voltage.

Another embodiment provides an electrostatic discharge protection circuit comprising a previously-described transistor.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
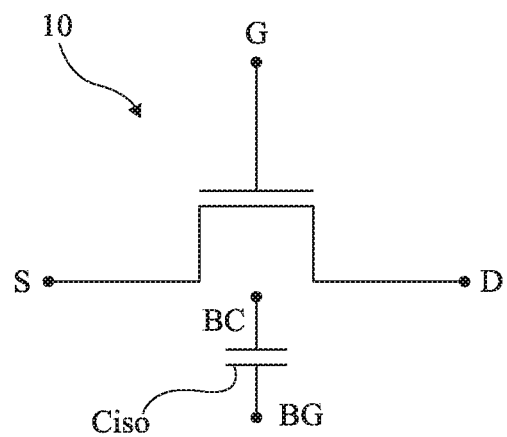
FIG. 1 shows a circuit diagram of a BiMOS-type transistor.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

The following designations are used in the disclosure, as usual:

lightly-doped semiconductor layer designates a layer having a dopant atom concentration in the range from $10^{14}$ to $5 \times 10^{17}$ atoms/cm$^3$;

heavily-doped semiconductor layer designates a layer having a dopant atom concentration in the range from $5 \times 10^{17}$ to $10^{18}$ atoms/cm$^3$; and very heavily-doped semiconductor layer designates a layer having a dopant atom concentration in the range from $10^{18}$ to $10^{21}$ atoms/cm$^3$.

Symbol "^" represents the power function.

FIG. 1 is a circuit diagram of a BiMOS-type transistor 10. A BiMOS transistor is a transistor implementing the effects of a bipolar transistor and the effects of a MOS transistor. More particularly, a BiMOS-type transistor is an N-channel MOS transistor (NMOS) further comprising a contact region coupled to the channel-forming region of the NMOS transistor. The contact region is P-type doped, for example, very heavily P-type doped. The contact region is called channel contact or body contact region hereafter. An example of use of a BiMOS-type transistor is described in relation with FIG. 2.

The BiMOS transistor may be formed, for example, inside and on top of a P-type doped solid substrate or inside and on top of a silicon-on-insulator (SOI) structure. The BiMOS transistor illustrated in FIG. 1 is a transistor formed inside and on top of a SOI structure.

In the case where the BiMOS transistor is formed inside and on top of a solid substrate, the source, drain, and channel-forming regions of the NMOS transistor and the channel contact region are formed in a portion of the substrate separated from the rest of the substrate by N-type doped regions, for example, very heavily N-type doped. The N-type doped regions are generally positively biased. Said substrate being P-type doped, the regions of the NMOS transistor and the channel contact region are insulated from the rest of the substrate by a blocked N-P junction. The NMOS transistor further comprises a substrate contact region formed in the substrate and P-type doped, for example, very heavily P-type doped.

An SOI structure is a structure where a semiconductor substrate is covered with an insulating layer, called buried oxide layer (BOX), which is itself covered with an upper semiconductor layer. There exist a plurality of types of SOI structure, one of them being the FDSOI (Fully Depleted Silicon On Insulator) structure where the buried insulating layer, for example, has a thickness in the order of 25 nm, and where the semiconductor layer, for example, has a thickness in the order of 7 nm. A specificity of the FDSOI structure is that when a channel-forming region of a transistor is arranged in the upper semiconductor layer, the created depletion layer occupies the entire thickness of the semiconductor layer.

In the case where the BiMOS transistor is formed inside and on top of an SOI-type structure, for example, of FDSOI type, the source region, the drain region, the channel-forming region of the NMOS transistor forming it, and the channel contact region are formed inside and on top of the upper semiconductor layer. The BiMOS transistor may further comprise a substrate contact region enabling to bias the substrate of the SOI structure. The substrate contact region and the channel contact region form, with the buried insulating layer of the structure, a capacitor.

The circuit diagram of a BiMOS-type transistor is a circuit diagram of an NMOS transistor further comprising a contact forming the channel contact region. Transistor 10, when it is formed inside and on top of a SOI structure, thus comprises: a source S; a drain D; a gate G; a channel contact BC; and a substrate contact BG.

Further, a capacitor Ciso is represented as coupling channel contact BC and substrate contact BG representing the capacitor formed by the SOI structure.

Figure 2:
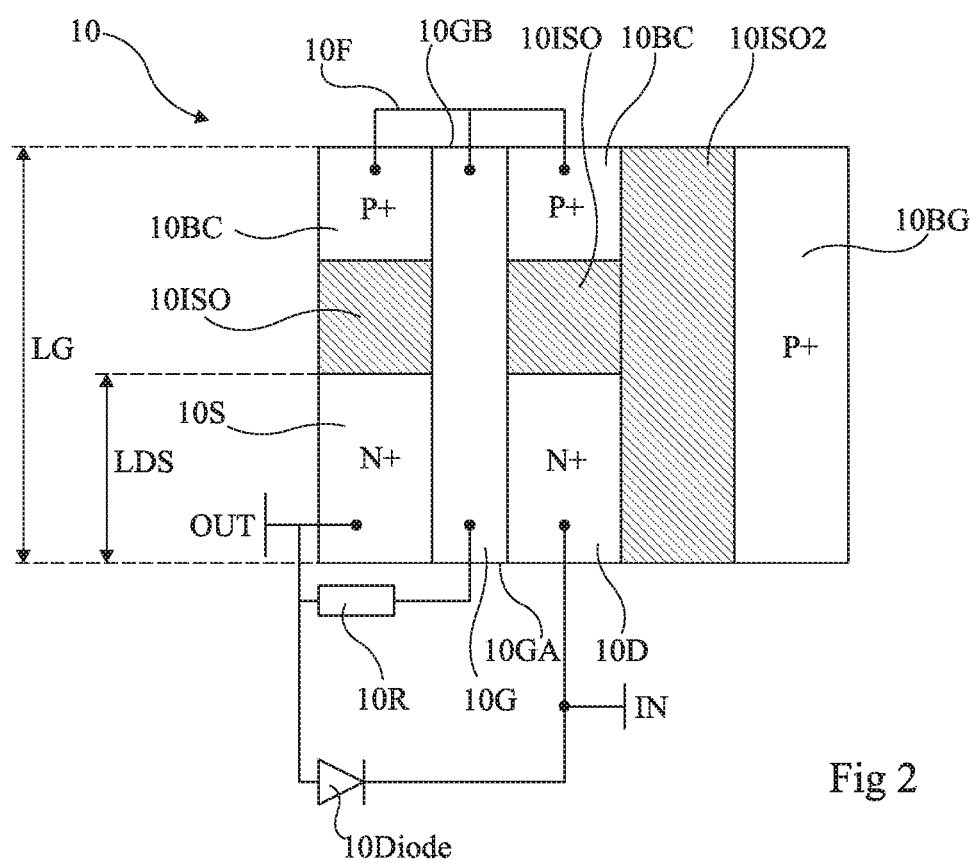
FIG. 2 shows a simplified top view of a BiMOS-type transistor.

A BiMOS-type transistor may be formed by different structures, one of which is described in relation with FIG. 2.

FIG. 2 is a top view of an example of a structure of a BiMOS-type transistor 10 formed inside and on top of a SOI structure, and more particularly a FDSOI structure.

Transistor 10 comprises: a very heavily-doped N-type source region 10S (N+); a very heavily-doped N-type drain region 10D (N+); a channel-forming region or channel region (not shown in FIG. 2) topped with a gate stack, or gate region, 10G; a very heavily-doped P-type substrate contact region 10BG (P+); and two very heavily-doped P-type channel contact regions 10BC (P+).

Transistor 10 further comprises a substrate contact region which is not shown in FIG. 2, insulated from the other regions.

Source and drain regions 10S and 10D are arranged on either side of the channel region and of gate stack 10G. Source and drain regions 10S and 10D have, in top view, a shape, for example, rectangular, and a length LDS. Channel and gate regions 10G have, in top view, a for example rectangular shape and a length LG. Length LG is greater than length LDS. Further, source and drain regions 10S and 10D extend along gate region 10G from one end 10GA of gate region 10G.

The two channel contact regions 10BC are arranged on either side of channel and gate regions 10G. Channel contact regions 10BC extend along gate region 10G from an end 10GB, opposite to end 10GA, of gate region 10G. Channel contact regions 10BC are separated from source and drain regions 10S and 10D by insulating regions 10ISO arranged on either side of the channel and gate regions 10G. Channel contact regions 10BC are only in contact with the channel region and insulating regions 10ISO.

Substrate contact region 10BG is arranged on one side of transistor 10, and is separated from the other regions by an insulating region 10ISO2. Regions 10ISO2 and 10BG have, in top view, a shape, for example, rectangular, extending along the other regions.

A BiMOS-type transistor may be used as a protection against overvoltages. To achieve this, a way of connecting BiMOS-type transistor 10 is the following:

coupling its gate region 10G to channel contact regions 10BC via one or a plurality of wires or vias 10F;

coupling its source region 10S to an output node OUT;

coupling its drain region 10D to an input node IN; and coupling its gate region 10G to output node OUT via a resistor 10R.

In such a configuration, transistor 10, for example, enables to filter positive electrostatic discharges. Transistor 10 may further be coupled to a reverse diode enabling to filter negative electrostatic discharges. Such a diode 10Diode has its cathode coupled, preferably connected, to input node IN, and its anode coupled, preferably connected, to output node OUT.

Transistor 10, in this case, operates as follows. A stray capacitance (noted drain-gate capacitance) is formed by drain and gate regions 10D and 10G. The drain-gate capacitance and resistor 10R form an RC circuit. When an overvoltage occurs on the input node, it biases drain region 10D which, by capacitive effect, biases gate region 10G. Transistor 10 then triggers and becomes conductive.

Figure 3:
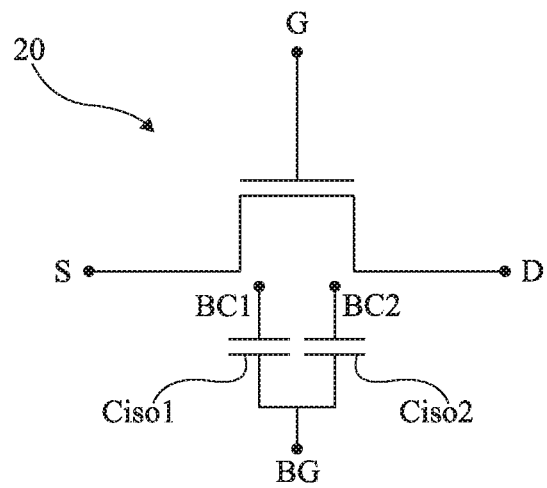
FIG. 3 shows a circuit diagram of an embodiment of a BiMOS-type transistor.

FIG. 3 is a circuit diagram of an embodiment of a BiMOS-type transistor 20.

Transistor 20 is similar to the transistor 10 described in relation with FIG. 1, with the difference that, when transistor 20 is used as an electrostatic discharge protection component, instead of having its two channel contact regions coupled to the gate, a single one of them is, and the second one is coupled to a reference potential of an output node. The two channel contact regions are not in contact with each other. As an example, the two channel contact regions are each formed at an end of transistor 20.

Like the transistor 10 described in relation with FIG. 1, transistor 20 may be formed inside and on top of a solid substrate, or inside and on top of a SOI structure.

Figure 4:
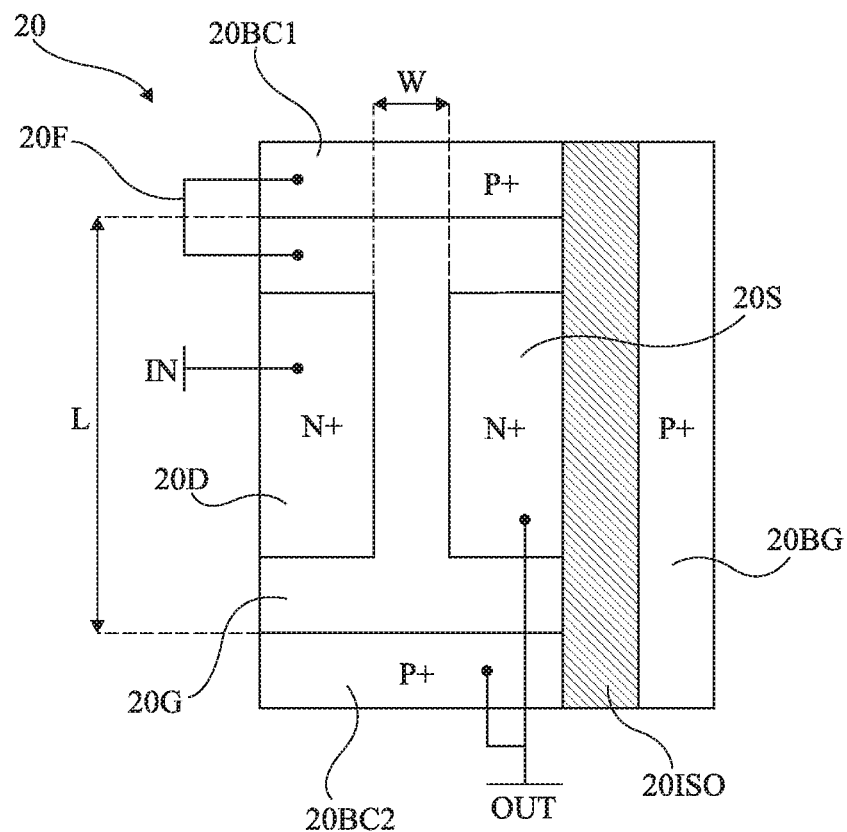
FIG. 4 shows a simplified top view of an embodiment of a BiMOS-type transistor.

An example of use of BiMOS-type transistor 20 is described in relation with FIG. 4.

The circuit diagram of transistor 20 is a circuit diagram of an NMOS transistor to which two contacts forming the channel contact regions have been added. Thus, transistor 20, when it is formed inside and on top of an SOI structure, comprises: a source S; a drain D; a gate G; two channel contacts BC1 and BC2; and a substrate contact BG.

Further, transistor 20 comprises, between each channel contact BC1, BC2 and substrate contact BG, a capacitor Ciso1, Ciso2 representing the capacitors formed by the FDSOI structure.

Transistor 20 may be formed by different structures, one of which is described in relation with FIG. 4.

FIG. 4 is a top view of an embodiment of a BiMOS-type transistor 20 formed inside and on top of a SOI structure, and more particularly, inside and on top of a FDSOI structure.

Transistor 20 comprises: a very heavily-doped N-type source region 20S (N+); a very heavily-doped N-type drain region 20D (N+); a channel region (not shown in FIG. 2) topped with a gate stack, or gate region 20G; a very heavily-doped P-type substrate contact region 20BG (P+); and two very heavily-doped P-type channel contact regions 20BC1 and 20BC2 (P+).

Channel and gate regions 20G have in top view, for example, the shape of a lying H. More particularly, channel and gate regions 20G comprise two parallel branches and one central branch perpendicular to the two others. The central branch couples the two parallel branches. The main branch has a thickness W. Channel and gate regions 20G have a length L (see FIG. 4).

Source and drain regions 20S and 20D are arranged on either side of the main branch of the channel region, between the parallel branches. Source and drain regions 20S and 20D have, in top view, for example, a rectangular shape.

The two channel contact regions 20BC1 and 20BC2 are arranged on either side of the channel and gate regions 20G, and more particularly arranged on the outer side of the two parallel branches of the channel and gate regions 20G. In other words, each channel contact region is arranged at one end of transistor 20.

Substrate contact region 20BG is arranged on one side of transistor 20, and is separated from the other regions by an insulating region 20ISO. Regions 20ISO and 20BG have, in top view, for example a rectangular shape extending along the other regions.

A use of transistor 20 as an overvoltage protection component may achieved as follows.

Drain region 20D is coupled, preferably connected, to an input node IN. Source region 20S is coupled, preferably connected, to an output node OUT. Output node OUT may, for example, be capable of receiving a reference potential, for example, the ground. Channel contact region 20BC1 is coupled, preferably connected, to gate region 20G via one or a plurality of wires or vias 20F. Channel contact region 20BC2 is coupled, preferably connected, to output node OUT.

An advantage of transistor 20 is that it may be used as an overvoltage protection circuit, and more particularly as an electrostatic discharge protection circuit, without requiring an additional resistor like transistor 10 described in relation with FIG. 2. An advantage thereof is that a structure of the type described in relation with FIG. 4 is more compact and thus provides a space gain with respect to a structure comprising a conventional BiMOS-type transistor and a resistor coupled together. The number of necessary metal connections is also decreased.

Further, coupling one of the channel contact regions, here, regions 20BC2, to output node OUT enables to distribute the internal resistance of the channel region of transistor 20 along the entire length of the gate region of transistor 20. An equivalent circuit diagram of transistor 20 is described in relation with FIG. 5.

Another advantage of transistor 20 is that it is possible to adjust the trigger voltage of transistor 20, that is, the voltage to be applied between source and drain regions 20S and 20D to turn on transistor 20, by only adjusting internal resistance R of the channel region of transistor 20. Indeed, the more the internal resistance of the channel region increases, the more the trigger voltage decreases.

The internal resistance R of the channel region of transistor 20 is defined by the following formula:

$$R = \rho \frac{L}{W * T}$$

where: $\rho$ designates the resistivity of the material of the channel region; L designates the length of the channel region; W designates the width of the channel region; and T designates the channel thickness in a direction orthogonal to the plane of the drawing.

It is thus possible to vary four different parameters to decrease the trigger voltage of transistor 20.

As an example, it is possible to modify internal resistance R by forming an opening in the buried insulating layer of the FDSOI structure having the transistor formed therein. Thus, the resistance of the substrate of the structure has an influence upon the resistance of the channel region.

It is also possible to modify the resistance of the channel region by applying a positive or negative potential between substrate region 20BG and output node OUT. Indeed, a biasing of the substrate may enable, by capacitive effect with the buried insulating layer of the SOI structure, to modify the resistance of the channel region. In particular, a negative biasing of the channel region may enable to decrease the internal resistance of the channel region. This is only possible when the transistor is formed inside and on top of a SOI structure.

As an example, it is possible to decrease internal resistance R by decreasing length L of the channel region.

As an example, it is possible to decrease internal resistance R by increasing width W of the channel region. The modification of this parameter may also modify the thermal voltage of the transistor.

Another advantage of the transistor 20 described in relation with FIG. 4 is that it further comprises a parasitic diode between terminals IN and OUT enabling to filter negative electrostatic discharges. More particularly, this diode is formed by P-type doped channel contact region 20BC2 and the P-type channel region (anode of the parasitic diode) and by N-type doped drain region 20D (cathode of the parasitic diode). The structure of transistor 20 may thus enables to do away with the diode 10Diode described in relation with FIG. 2.

Figure 5:
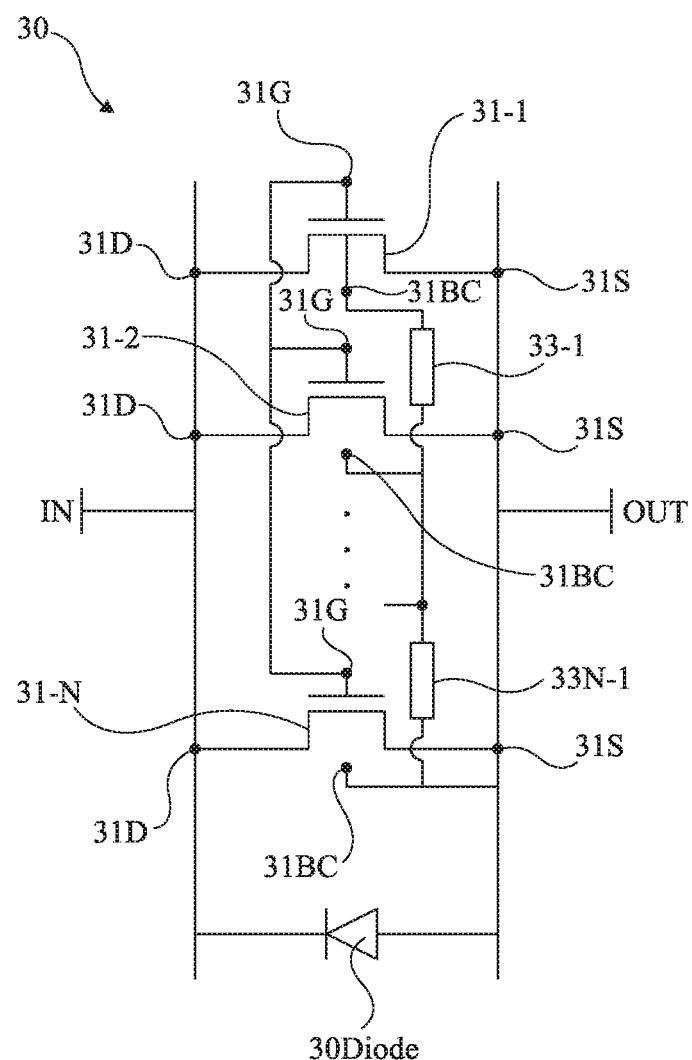
FIG. 5 shows an equivalent circuit diagram of the transistor of FIG. 4.

FIG. 5 is a circuit diagram of a circuit 30 equivalent to the BiMOS-type transistor 20 described in relation with FIG. 4.

Circuit 30 comprises a number N of conventional distributed BiMOS-type transistors 31-1 to 31-N, for example, of the type of transistor 10 described in relation with FIGS. 1 and 2, and a number N-1 of resistors 33-1 to 33-N-1. Number N is, for example, greater than or equal to 2, for example, equal to 3. The sum of the resistivities of resistors 33-1 to 33-N-1 is equal to the internal resistance R of the channel region of transistor 20.

Transistors 31-1 to 31-N are connected in parallel with one another, and between input node IN and output node OUT. More particularly, the drains 31D of transistors 31 are thus coupled, preferably connected, to input node IN. Sources 31S are coupled, preferably connected, to output node OUT. Gates 31G are coupled, preferably connected, together.

Further, channel contacts 31BC are coupled together via a resistor 33. More particularly, each channel contact 31BC of transistor 31-$i$, with i varying from 1 to N-1, is coupled to the channel contact of the next transistor 31-$i$+1 via a resistor 33-$i$. The channel contact of the last transistor, transistor 31-N, is further coupled, preferably connected, to output node OUT.

Circuit 30 may further comprise a diode 30Diode coupling input node IN and output node OUT. More particularly, the anode of diode 30Diode is coupled, preferably connected, to output node OUT, and its cathode is coupled, preferably connected, to input node IN. Diode 30Diode represents the parasitic diode formed by channel contact region 20BC2 and by the drain region 20D described in relation with FIG. 4. The representation of this diode in this equivalent circuit diagram is optional.

Circuit 30 operates as follows.

When a positive electrostatic discharge occurs between input node IN and output node OUT, transistors 31-1 to 31-N start one after the others according to the operation described in relation with FIGS. 1 and 2.

Diode 30Diode enables to filter negative electrostatic discharges.

Finally, the practical implementation of the described embodiments and variations is within the abilities of those skilled in the art based on the functional indications given hereabove. In particular, in FIG. 4, the channel and gate regions of the transistor are H-shaped, but they might have any other shape, provided for each channel contact region to be separate from the other channel contact region, for example, distant from the other. The channel contact regions are for example each arranged at one end of the transistor.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A BiMOS-type transistor, comprising:
a gate region;
a first channel contact region;
wherein a first potential is electrically applied to both said gate region and said first channel contact region; and
a second channel contact region;
wherein a second potential different than the first potential is electrically applied to said second channel contact region.

2. The transistor of claim 1, wherein the first and second channel contact regions are arranged at opposite ends of the gate region.

3. The transistor of claim 1, formed inside and on top of a silicon on insulator (SOI) structure.

4. The transistor of claim 1, formed inside and on top of a fully depleted silicon on insulator (SOI) structure.

5. The transistor of claim 1, formed inside and on top of an electrically-insulated portion of a solid substrate.

6. The transistor of claim 1, further comprising a channel region of the transistor positioned under the gate region, wherein the first and second channel contact regions are P-type doped regions in contact with said channel region.

7. The transistor of claim 6, wherein the first and second channel contact regions are very heavily P-type doped regions.

8. The transistor of claim 6, wherein the channel region and the gate region have, in top view, an H shape comprising a first and second branches parallel to each other, and a third branch coupling the first and second branches, and being perpendicular to the first and second branches.

9. The transistor of claim 8, wherein the first channel contact region is in contact with the first branch of the channel region, and wherein the second channel contact region is in contact with the second branch of the channel region.

10. The transistor of claim 8, wherein source and drain regions of the transistor are positioned on either side of the third branch of the channel region.

11. The transistor of claim 1, wherein the second potential is a ground reference voltage.

12. The transistor of claim 1, wherein the second potential is an output voltage.

13. An electrostatic discharge protection circuit, comprising:
a BiMOS-type transistor, comprising:
a gate region;
a drain region coupled to an input of the electrostatic discharge protection circuit;
a source region coupled to an output of the electrostatic discharge protection circuit;
a first channel contact region;
wherein a first potential is electrically applied to both said gate region and said first channel contact region; and
a second channel contact region;
wherein a second potential, different from the first potential, is electrically applied to both said source region and said second channel contact region.

14. The electrostatic discharge protection circuit of claim 13, wherein the first and second channel contact regions are arranged at opposite ends of the gate region.

15. The electrostatic discharge protection circuit of claim 13, formed inside and on top of a silicon on insulator (SOI) structure.

16. The electrostatic discharge protection circuit of claim 13, formed inside and on top of a fully depleted silicon on insulator (SOI) structure.

17. The electrostatic discharge protection circuit of claim 13, formed inside and on top of an electrically-insulated portion of a solid substrate.

18. The electrostatic discharge protection circuit of claim 13, further comprising a channel region of the transistor positioned under the gate region, wherein the first and second channel contact regions are P-type doped regions in contact with said channel region.

19. The electrostatic discharge protection circuit of claim 18, wherein the first and second channel contact regions are very heavily P-type doped regions.

20. The electrostatic discharge protection circuit of claim 18, wherein the channel region and the gate region have, in top view, an H shape comprising a first and second branches parallel to each other, and a third branch coupling the first and second branches, and being perpendicular to the first and second branches.

21. The electrostatic discharge protection circuit of claim 20, wherein the first channel contact region is in contact with the first branch of the channel region, and wherein the second channel contact region is in contact with the second branch of the channel region.

22. The electrostatic discharge protection circuit of claim 20, wherein source and drain regions of the transistor are positioned on either side of the third branch of the channel region.

23. The electrostatic discharge protection circuit of claim 13, wherein the second potential is a ground reference voltage.

* * * * *